(12) United States Patent
Lai

(10) Patent No.: US 7,088,582 B2
(45) Date of Patent: Aug. 8, 2006

(54) HEAT-DISSIPATING DEVICE

(75) Inventor: Tian-Yuan Lai, Sanchung (TW)

(73) Assignee: Kocam International Co., Ltd. (TW)

( * ) Notice: Subject to any disclaimer, the term of this patent is extended or adjusted under 35 U.S.C. 154(b) by 209 days.

(21) Appl. No.: 10/761,196

(22) Filed: Jan. 22, 2004

(65) Prior Publication Data

US 2005/0162827 A1 Jul. 28, 2005

(51) Int. Cl.
*H05K 7/20* (2006.01)
(52) U.S. Cl. .............. 361/690; 165/80.3; 165/185; 165/131; 361/704; 361/710; 174/16.3
(58) Field of Classification Search ............ 361/690; 165/80.3, 185
See application file for complete search history.

(56) References Cited

U.S. PATENT DOCUMENTS 4,926,935 A * 5/1990 Haushalter .............. 165/185
6,125,921 A * 10/2000 Kuo ....................... 165/80.3
6,208,517 B1 * 3/2001 Prince et al. ............ 361/704
6,422,307 B1 * 7/2002 Bhatti et al. ............ 165/185
6,575,229 B1 * 6/2003 Taban ..................... 165/80.3
6,749,009 B1 * 6/2004 Barten .................... 165/80.3
2004/0206475 A1 * 10/2004 Lee et al. ................. 165/78
2005/0056398 A1 * 3/2005 Lai ........................ 165/80.3

* cited by examiner

*Primary Examiner*—Lynn Feild
*Assistant Examiner*—Biju Chandran
(74) *Attorney, Agent, or Firm*—Bacon & Thomas

(57) ABSTRACT

The present invention is to provide a heat-dissipating device comprising a sheet formed thereon with a plurality of first parts and a plurality of second parts, wherein any one of said second part is disposed between any two of said first parts, and the junction therebetween is bent with an angle enabling the ends of two adjacent first parts distal to the second part to be connected with each other. As a result, the second parts form corresponding parallel plates respectively on each side of a heat-dissipating device for being placed on a heat-source to dissipate heat transmitted therefrom, and the first parts act as the supporting plates for supporting the parallel plates.

8 Claims, 5 Drawing Sheets

HEAT-DISSIPATING DEVICE

BACKGROUND OF THE INVENTION

1. Background of the Invention

The present invention relates to a heat-dissipating device, more specifically relating to a heat-dissipating device manufactured by utilizing stamping and bending skills to form its structure as a whole.

2. Description of the Prior Art

As shown in FIG. 1, the conventional heat-dissipating device is formed as a U-shaped board 10 in sectional view where a first wedging part 12 (such as a hole) is respectively disposed on the two corresponding sides of the U-shaped board 10, and a second wedging part 14 is respectively disposed on the ends of the two corresponding sides adjacent to the first wedging parts 12. By utilizing the structure, a plurality of the U-shaped boards with the same structure can be connected with each other to form a heat-dissipating device 1, in which any two adjacent U-shaped boards are connected by wedging the corresponding first wedging parts 12 and second wedging parts 14 thereof together. In the conventional heat-dissipating device 1, each U-shaped board 10 has two parallel plates 16 and a supporting plate 18 disposed between the two parallel plates 16. Therefore, the parallel plates 16 of the U-shaped boards 10 at one side of the heat-dissipating device 1 can then be in contact with a heat-source (such as a central processing unit of a computer), and the heat dissipated from the heat-source can be transmitted to the supporting plates 18 and then through the supporting plates 18 to the parallel plates 16 at another side of the heat-dissipating device 1, and be distributed to the outer environment for protecting the heat-source from damage due to over heat.

Conventionally, the U-shaped board 10 is usually formed by utilizing a stamping machine to stamp a copper sheet. The area of the copper sheet must be larger than the size of the U-shaped board 10 for forming the first wedging part 12 and the second wedging part 14 thereon and then stamping the copper sheet into the required U-shaped. Therefore, during the process of fabricating the U-shaped board 10, many parts of the copper sheet must be cut off and become useless, which eventually cause lots of raw materials of the copper sheet to be wasted.

SUMMARY OF THE INVENTION

The object of the present invention is to provide a heat-dissipating device comprising a sheet formed thereon with a plurality of first parts and a plurality of second parts, wherein any one of said second part is disposed between any two of said first parts, and the junction between every two adjacent first part and second part is bent with an angle enabling the ends of two adjacent first parts distal to the second part to be connected with each other. As a result, the second parts act as two corresponding parallel plates respectively on each side of a heat-dissipating device, and the first parts then act as the supporting plates for supporting the parallel plates. Therefore, while one side of the heat-dissipating device is placed on a heat-source, heat dissipated from the heat-source can be transmitted to the heat-dissipating device to be distributed to the outer environment, which protects the heat-source from damage owing to the over heat.

Another object of the present invention is that, in each unit of the heat-dissipating device, at least a first connecting member is disposed on one first part at one end distal to one end of a second part, and a second connecting member is disposed on another first part at one end distal to another end of the second part, where the first and second connecting member are disposed at the positions corresponding to each other, enabling one end of two adjacent first parts to be connected with each other and becoming hard to be separated Another object of the present invention is that a joint part is disposed at the place, where the corresponding ends of two adjacent first parts 20 are in contact with each other, in order to enhance the connection effect therebetween and ensure the two adjacent first parts hard to be separated.

The above and other objects, features and advantages of the present invention will become apparent from the following detailed description taken with the accompanying drawings.

DETAILED DESCRIPTION OF A PREFERRED EMBODIMENT

Figure 1:
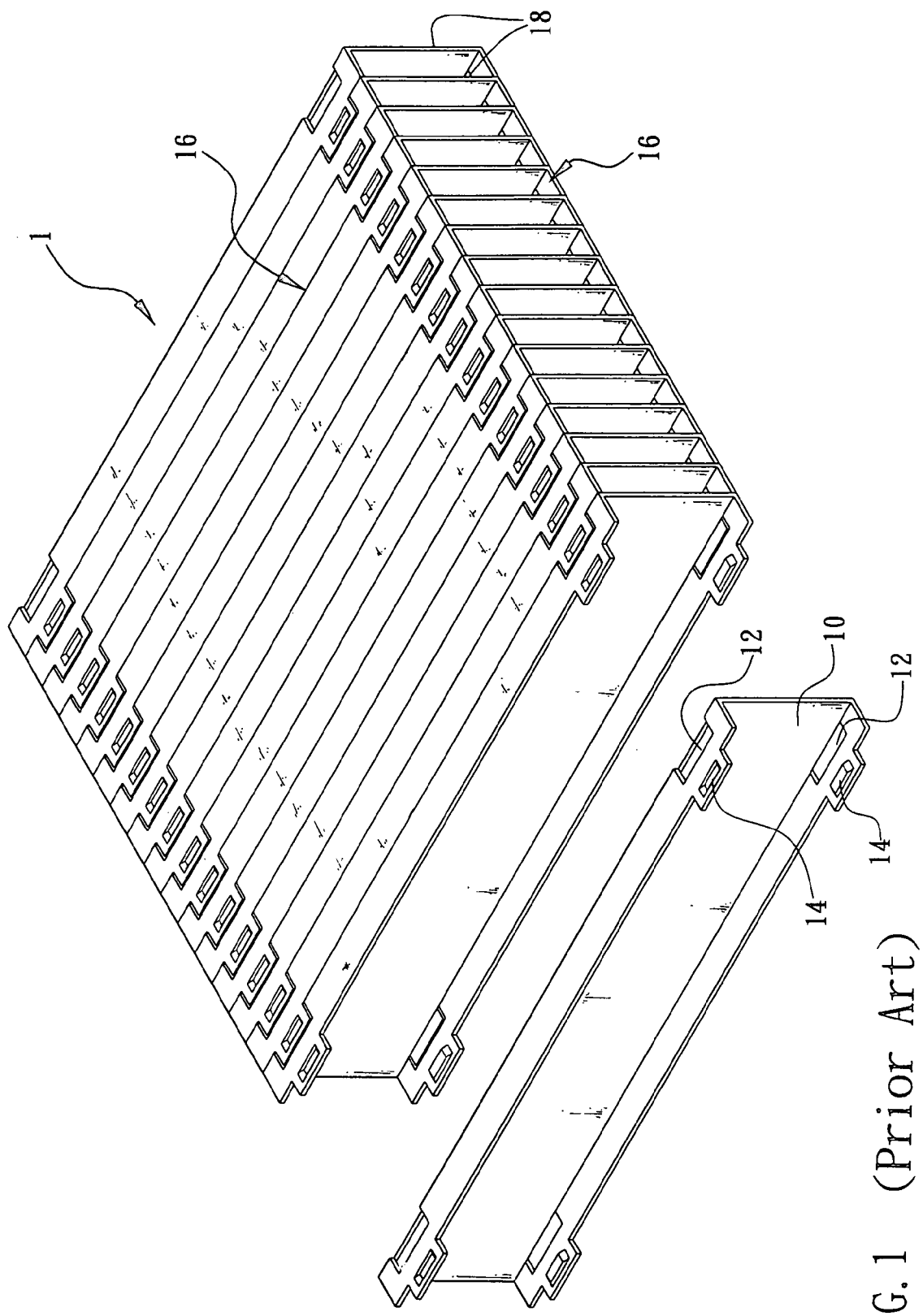
FIG. 1 is a perspective view of the conventional heat-dissipating device.
Figure 2:
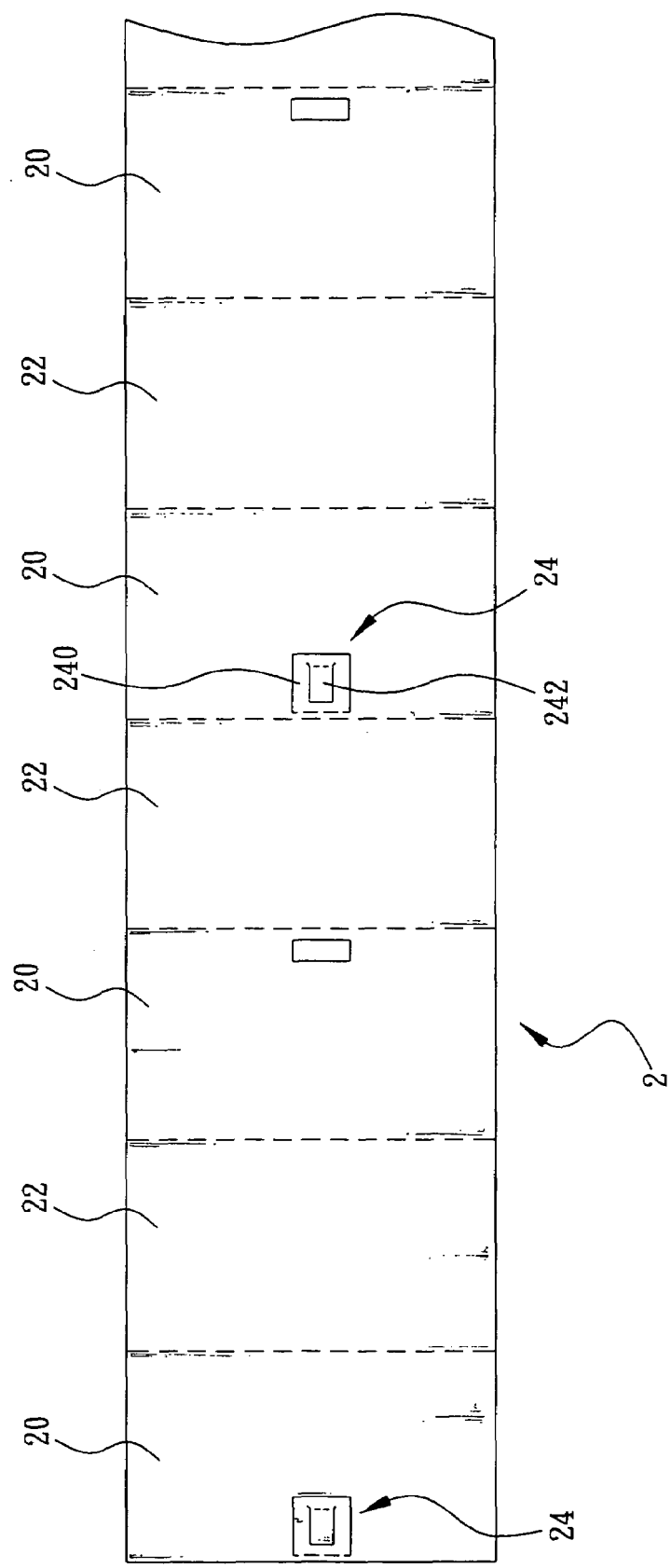
FIG. 2 is a top view of the heat-dissipating device according to one embodiment of the present invention.
Figure 3:
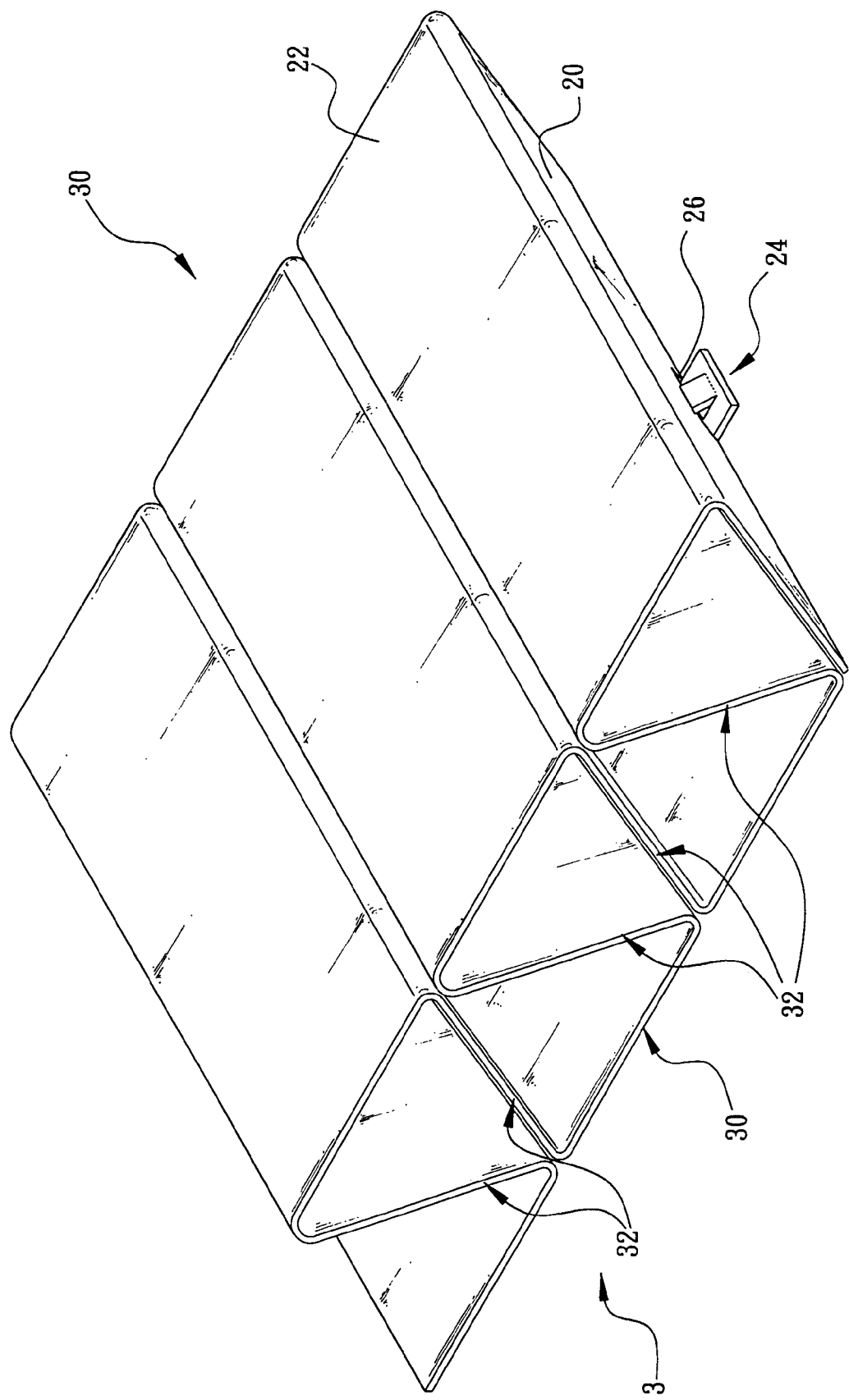
FIG. 3 is a perspective view of the heat-dissipating device shown in FIG. 2.

FIGS. 2 and 3 show one embodiment according to the present invention, which relates to a heat-dissipating device made by a metal sheet 2 being bent to form a plurality of first parts 20 and a plurality of second parts 22, wherein at least one of the second parts 22 is disposed between two adjacent first parts 20. The junction between the first part 20 and the second part 22 is bent with an angle enabling any two adjacent first parts 20 to be connected with each other at the corresponding ends distal to the second part 22. As a result, any two adjacent second parts 22 act as two corresponding parallel plates 30 of a heat-dissipating device 3, and the first part 20 therebetween acts as a supporting plate 32 of the heat-dissipating device 3 for supporting the two parallel plates 30 adjacent thereto. Therefore, adjacent sections of the heat-dissipating device 3 are composed of two parallel plates 30 along with two supporting plates 32 therebetween. While the parallel plates 30 on one side of the heat-dissipating device 3 are in contact with a heat-source, such as a central processing unit of a computer, heat dissipated from the heat-source can be transmitted to the supporting plates 32 and through the supporting plates 32 to the parallel plates 30 on another side thereof for distributing the heat to the outer environment to protect the heat-source from damage due to over heat. Besides, since any two adjacent first parts 20 of the heat-dissipating device 3 are connected at the corresponding ends for supporting with each other, two adjacent first parts 20 strengthen the structure of the heat-dissipating device 3 not easily being crushed by the force acted thereon. Further, the fabrication of the heat-dissipating device 3 directly utilizes stamping and bending skills to form the structure thereof on the metal sheet, which is more convenient than the fabrication of the conventional method via pre-producing a plurality of U-shaped heat-dissipating sheets and then composing a certain amount of the U-shaped heat-dissipating sheets to form the required heat-dissipating device. Besides, the fabrication of directly bending the metal sheet to form the heat-dissipating device according to the present invention significantly minimize the amount of wasted raw materials being produced than the conventional method.

According to the embodiment of present invention, as shown in FIG. 3, within each unit of the heat-dissipating device 3, at least one first connecting member 24 is disposed on one first part 20 at one end thereof distal to one end of the second part 22, and a second connecting member 26 is disposed on another first part 20 adjacent thereto at one end thereof distal to another end of the second part 22, enabling the second connecting member 26 disposed on the end of the first part 20 is exactly on the position corresponding to the first connecting member 24 disposed on the another first part 20 for connecting the two adjacent first parts 20 together.

During the bending fabrication, the sheet 2 is bent along with the junction between the first part 20 and the second part 22 and in a direction to enable the first connecting member 24 and the second connecting member 26 respectively disposed on two adjacent first parts 20 to latch with each other. Then, the second parts 22 adjacent to the first parts 20 are in turn parallel with each other forming two corresponding parallel plates 30 on two sides of the heat-dissipating device 3. As a result, the first parts 20 turn out to be the supporting plates 32 of the heat-dissipating device 3 for supporting the parallel plates 30.

Moreover, the first connecting member 24 is of the structure able to be latched with the second connecting member 26 adjacent thereto while the sheet 2 being bent in a direction enabling one end of two adjacent first parts 20 being connected with each other and hard to be separated.

After the first connecting member 24 and the second connecting member 26 respectively disposed on two adjacent first parts 20 are connected with each other, the ends of the two adjacent first parts 20 distal to the second parts 22 are then in contact and against with each other, which effectively enhance the structure of the heat-dissipating device 3 and protect it from being easily crushed in comparison with the conventional heat-dissipating device.

Figure 4:
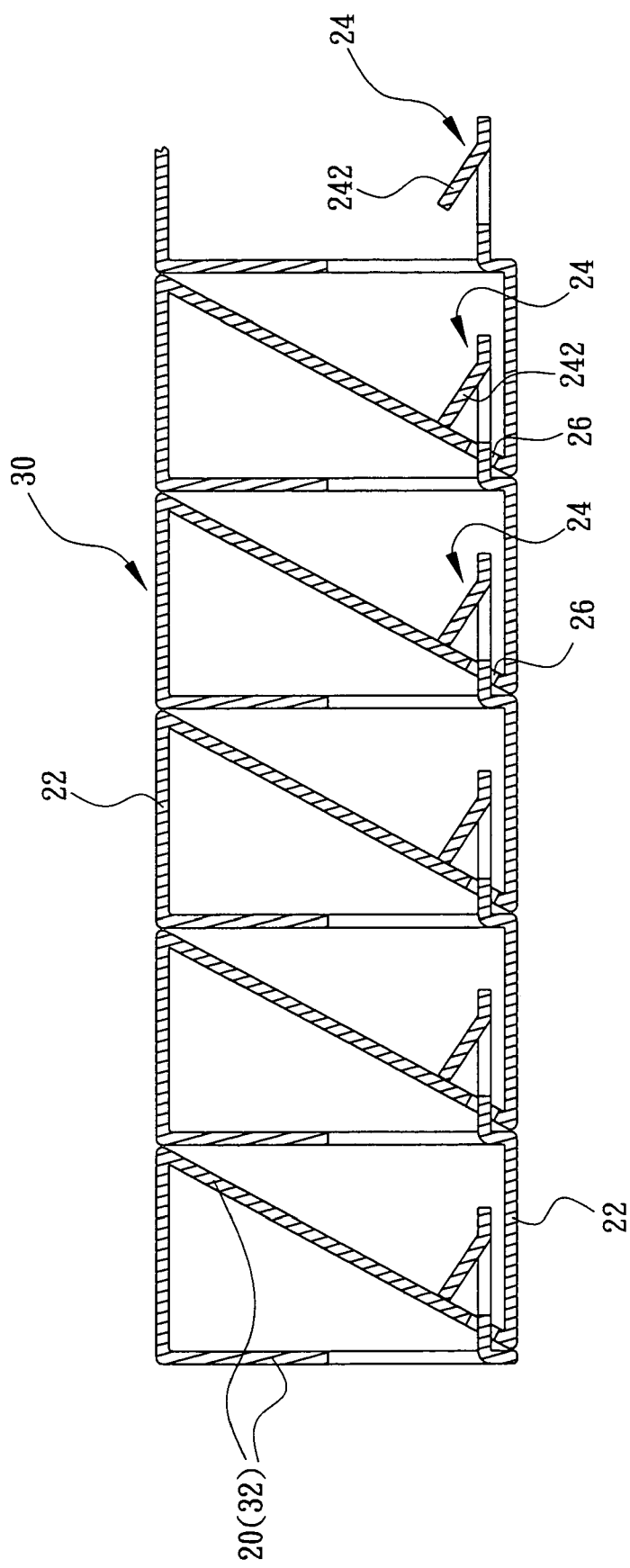
FIG. 4 is a sectional view of the heat-dissipating device according to another embodiment of the present invention.

As shown in FIG. 4, in the present invention, the lengths of the first parts 20 adjacent to different ends of the second part 22 may be different. However, the first parts 20 shall be of the lengths enabling the corresponding ends of two adjacent first parts 20 to be connected with each other after the junction between the first part 20 and the second part 22 being bent, and enabling the second parts 22 respectively disposed on two corresponding sides of the heat-dissipating device 3 to form two corresponding parallel plates 30 acting as the surfaces for absorbing heat, and enabling the first parts 20 disposed therebetween to act as the supporting plate 32 for supporting the two parallel plates 32 and dissipating heat transmitted from the parallel plates 30.

In another embodiment of present invention, as shown in FIG. 4, the supporting plate 32 adjacent to one end of the parallel plate 30 is perpendicular to the parallel plate 30, while the supporting plate 32 adjacent to another end of the parallel plate 30 is in a position having an angle θ with respect to the parallel plate 30. In other word, a tilting supporting plate 32 is then formed between any two corresponding parallel plates 30. In comparing the heat-dissipating device 3 of the present invention with the conventional heat-dissipating device, it is obvious that any two corresponding parallel plates 30 of the present invention have an extra tilting supporting plate 32 than the two parallel plates of the conventional heat-dissipating device of the same size, therefore, the heat-dissipating rate of the heat-dissipating device 3 of the present invention is more fast than the rate of the heat-dissipating device of the convention due to the extra tilting supporting plate 32.

In the another embodiment of the invention, at least one first connecting member 24 is disposed on a first part 20 at the end distal to one end of the adjacent second part 22, and a second connecting member 26 is disposed on the corresponding position of another first part 20 at the end distal to another end of the same second part 22. Therefore, the second connecting member 26 and the first connecting member 24 are respectively disposed on the corresponding positions of the ends of any two first parts 20 adjacent to a second part 22 for connecting the ends of the two first parts 20 together. After the sheet is bent along with the junction between the first part 20 and the second part 22, the corresponding first connecting member 24 and second connecting member 26 are latched with each other, at the same time, enabling corresponding ends of two first parts 20 adjacent to a second part 22 to be tightly connected with each other.

Besides, referring to FIG. 2, in the another embodiment of the invention, the first connecting member 24 further comprises a connecting plate 240, which is extended from the first part 20 and is bent to a position parallel to the second part 22, and a hook plate 242, which is extended from the connecting plate 240 and is bent to a position having an angle with respect to the second part 22. In the embodiment of the invention, the second connecting member 26 may be a through hole. Therefore, while the first connecting member 24 being connected with the second connecting member 26, the connecting plate 240 is inserted into the through hole (the second connecting member 26) from one side thereof, enabling the hook plate 242 to expand against another side of the through hole and latch two adjacent first parts 20 together and preventing the connecting plate 240 from being separated from the through hole (the second connecting member 26).

Figure 5:
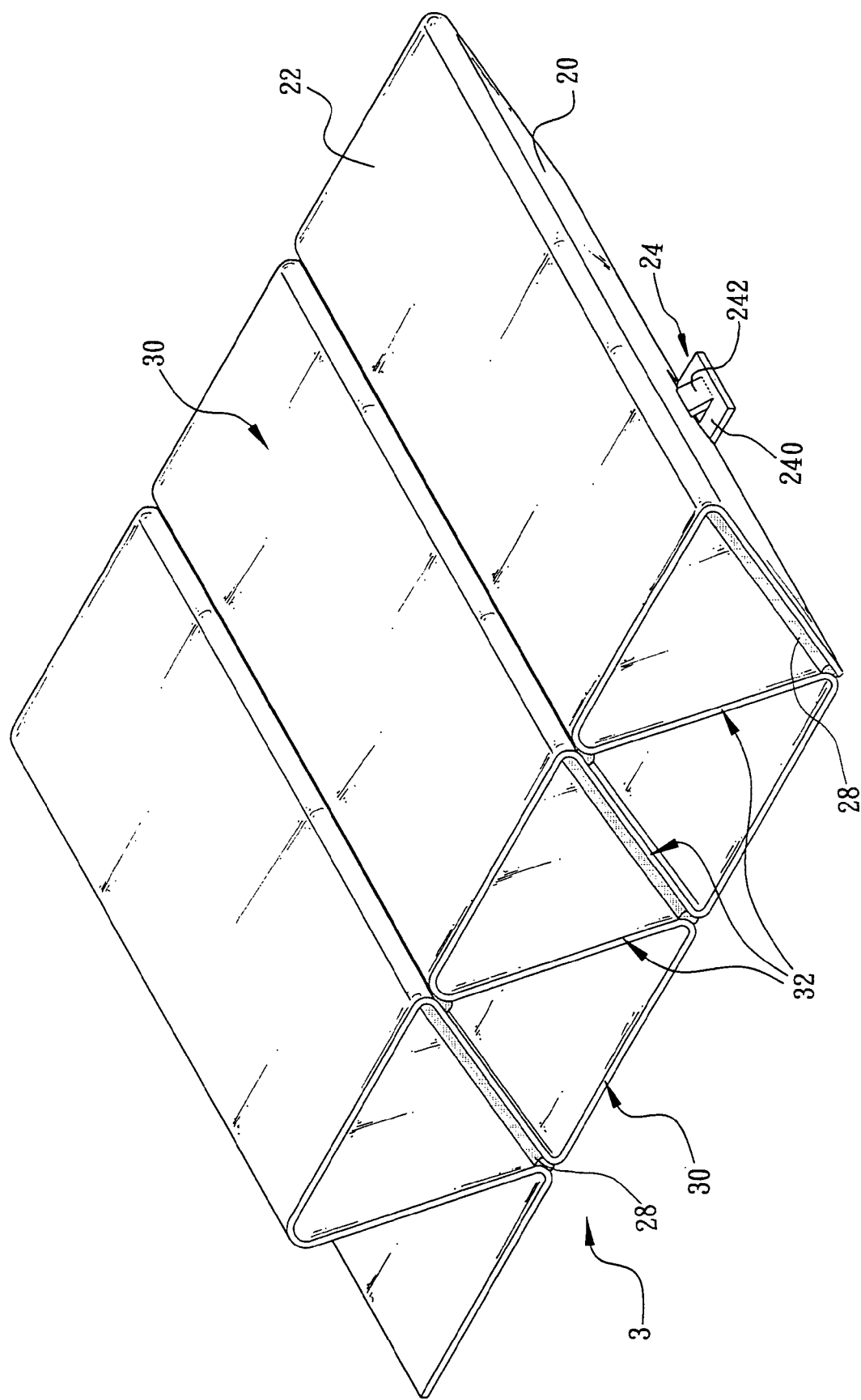
FIG. 5 is a perspective view of the heat-dissipating device according to another embodiment of the present invention.

Referring to FIG. 5, in the another embodiment of the invention, a joint part 28 is disposed at the place, where the corresponding ends of two adjacent first parts 20 are in contact with each other, in order to enhance the connection effect therebetween. In the another preferred embodiment, the joint part 28 may be formed by using one of the following methods:

1. Welding the corresponding ends of two adjacent first parts 20 together;

2. Using glue to attach the corresponding ends of two adjacent first parts 20 together;

3. Using rivets to attach the corresponding ends of two adjacent first parts 20 together.

Summing up the above, by utilizing the stamping and bending skills to directly form a sheet into the heat-dissipating device claimed in the present invention not only produces less waste material, but also significantly improve the defects of the conventional heat-dissipating sheet. Besides, the structure of the heat-dissipating device according to the present invention is also easier to be formed and implemented in an automatic fabrication for raising the production rate of the heat-dissipating sheet.

While the invention has been described by means of specific embodiments, numerous modifications and variations could be made thereto by those skilled in the art without departing from the scope and spirit of the invention set forth in the claims.

What is claimed is:

1. A heat-dissipating device comprising:

a sheet bent to form a plurality of first parts and a plurality of second parts, wherein at least one of said second parts is disposed between two adjacent first parts, and the junction between said first part and said second part is bent with an angle enabling said two adjacent first parts to be connected with each other at corresponding ends distal to said second part, wherein any two adjacent said second parts act as two corresponding parallel plates of a heat-dissipating device, and a first part therebetween acts as a supporting plate of the heat-dissipating device for supporting said two parallel plates adjacent thereto; and at least one first connecting member, which is disposed on a first part at the end distal to one end of an adjacent second part, and a second connecting member, which is disposed on a corresponding position of another first part at the end distal to another end of said adjacent second part, wherein said first and second connecting members are respectively disposed on the corresponding positions of the ends of any two adjacent first parts for connecting the ends of said two adjacent first parts together.

2. The heat-dissipating device according to claim 1, wherein said first parts adjacent to different ends of said second part are of the lengths enabling the corresponding ends of two adjacent said first parts to be connected with each other after the junction between the first part and the second part is bent.

3. The heat-dissipating device according to claim 1, wherein said first connecting member further comprises a connecting plate, which is extended from said first part and is bent to a position parallel to said second part, and a hook plate, which is extended from said connecting plate and is bent to a position having an angle with respect to said second part, wherein, while said first connecting member being connected with said second connecting member, said connecting plate is inserted into said second connecting member from one side thereof, enabling said hook plate to expand against another side of said second connecting member and latch said two adjacent first parts together and preventing said connecting plate from being separated from said second connecting member.

4. The heat-dissipating device according to claim 3, wherein said second connecting member may be a through hole.

5. The heat-dissipating device according to claim 1, wherein a joint part is disposed at the place, where the corresponding ends of said two adjacent first parts are in contact with each other, to connect the corresponding ends of said two adjacent first parts together.

6. The heat-dissipating device according to claim 5, wherein said joint part is formed by welding the corresponding ends of said two adjacent first parts together.

7. The heat-dissipating device according to claim 5, wherein said joint part is formed by using glue to attach the corresponding ends of said tow adjacent first parts together.

8. The heat-dissipating device according to claim 5, wherein said joint part is formed by using at least one rivet to attach the corresponding ends of said two adjacent first parts together.

* * * * *